United States Patent
Calvetti et al.

(10) Patent No.: US 9,991,000 B2
(45) Date of Patent: *Jun. 5, 2018

(54) MEMORY WITH MARGIN CURRENT ADDITION AND RELATED METHODS

(71) Applicant: STMicroelectronics S.r.l., Agrate Brianza (IT)

(72) Inventors: Emanuela Calvetti, Villa d'adda (IT); Marcella Carissimi, Treviolo (IT); Marco Pasotti, Travaco' Siccomario (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/476,618

(22) Filed: Mar. 31, 2017

(65) Prior Publication Data

US 2018/0040380 A1 Feb. 8, 2018

Related U.S. Application Data

(63) Continuation-in-part of application No. 15/225,898, filed on Aug. 2, 2016, now Pat. No. 9,646,684.

(51) Int. Cl.

| G11C 11/00 | (2006.01) |
|---|---|
| G11C 16/24 | (2006.01) |
| G11C 16/26 | (2006.01) |
| G11C 16/34 | (2006.01) |
| G11C 16/10 | (2006.01) |
| G11C 13/00 | (2006.01) |
| G11C 11/16 | (2006.01) |

(52) U.S. Cl.
CPC ............ *G11C 16/24* (2013.01); *G11C 11/161* (2013.01); *G11C 13/0004* (2013.01); *G11C 13/0033* (2013.01); *G11C 16/10* (2013.01); *G11C 16/26* (2013.01); *G11C 16/3427* (2013.01)

(58) Field of Classification Search
CPC .................................................. G11C 11/5678
USPC ........................................................ 365/163
See application file for complete search history.

(56) References Cited

U.S. PATENT DOCUMENTS

| 6,400,607 B1 * | 6/2002 | Pasotti ................ G11C 11/5642 365/185.2 |
|---|---|---|
| 8,264,872 B2 | 9/2012 | De Sandre et al. |
| 9,286,160 B2 | 3/2016 | Manda et al. |
| 9,324,399 B2 | 4/2016 | Pasotti et al. |
| 9,384,850 B2 | 7/2016 | Barsilai |
| 9,646,684 B1 * | 5/2017 | Calvetti ............. G11C 13/0004 |
| 2009/0080236 A1 | 3/2009 | Nakamura |
| 2010/0054031 A1 | 3/2010 | De Sandre et al. |
| 2010/0097833 A1 | 4/2010 | Kang et al. |

(Continued)

*Primary Examiner* — Hoai V Ho
(74) *Attorney, Agent, or Firm* — Slater Matsil, LLP

(57) ABSTRACT

In accordance with an embodiment, a circuit includes a sense amplifier circuit configured to sense a difference between a first current based on a direct memory bit and a second current based on a complementary memory bit. The direct memory bit is coupled to a first input of the sense amplifier circuit, and the complementary memory bit is coupled to a second input of the sense amplifier circuit. A controller is configured to, during a sense operation, selectively add a first margin current to the first current, and during the sense operation, selectively add a second margin current to the second current.

20 Claims, 7 Drawing Sheets

(56) References Cited

U.S. PATENT DOCUMENTS

2015/0228338 A1 8/2015 Manda et al.
2015/0235686 A1 8/2015 Pasotti et al.

* cited by examiner

MEMORY WITH MARGIN CURRENT ADDITION AND RELATED METHODS

CROSS-REFERENCE TO RELATED APPLICATIONS

This is a continuation-in-part of U.S. application Ser. No. 15/225,898, filed on Aug. 2, 2016, entitled "PCM Memory with Margin Current Addition and Related Methods," which application is hereby incorporated herein by reference.

TECHNICAL FIELD

The present invention relates generally to an electronic circuit, and, in particular embodiments, to memories and related methods.

BACKGROUND

Solid-state memory devices have become quite popular due to several advantages over typical active memory devices. First and foremost, the solid-state memory device comprises no moving parts, so it consumes less power and provides robust reliability. Moreover, solid-state memory devices are resistant to mechanical stress, such as impacts and vibration.

One type of memory used for solid-state memory devices is the flash memory device. The flash memory device may be based upon NAND or NOR logic gates, for example. For example, U.S. Patent Application Publication No. 2009/0080236 to Nakamura discloses a memory device. The memory device comprises a plurality of memory cells, and bit lines coupled to each memory cell. The memory device provides a supply voltage to each of the memory cells via the bit lines. Flash memory writing may be implemented by erasing a bank of memory and then programing the desired words into the memory. Because of the banc erasing and programing, flash memory programming may exhibit low granularity.

Another approach to solid-state memory is a phase-change memory. These devices, rather than using the floating gate approach of flash memory, use chalcogenide glass for storing data. In particular, chalcogenide glass may be forced to take either amorphous or crystalline form by exposing it to a prescribed level of heat. The current state is detected by detecting the resistivity of the chalcogenide glass, which predictably varies based upon the form thereof. In phase-change memory the granularity is bit by bit.

SUMMARY

In accordance with an embodiment, a circuit including: a sense amplifier circuit configured to sense a difference between a first current based on a direct memory bit and a second current based on a complementary memory bit, the direct memory bit coupled to a first input of the sense amplifier circuit, and the complementary memory bit coupled to a second input of the sense amplifier circuit; and a controller configured to, during a sense operation, selectively add a first margin current to the first current, and during the sense operation, selectively add a second margin current to the second current.

Generally speaking, a differential phase change material (PCM) memory may include first and second PCM elements, and a sense amplifier circuit configured to sense a difference between first and second sense currents passing through the first and second PCM elements, respectively, during a sense operation. The differential PCM memory may include a first margin current branch coupled in parallel with the first PCM element and configured to selectively add a first margin current to the first sense current, and a second margin current branch coupled in parallel with the second PCM element and configured to selectively add a second margin current to the second sense current. Particularly this PCM structure with margin current branches may be used to develop a method to check the current margin between direct and complementary cells, which uses three differential readings, the first with no current margin added, the second with a current margin added to the direct cells and the third with a current margin added to complementary cells. This allows to check 0's and 1's current margin, and if the required margin is not respected, to refresh the memory content.

More specifically, each of the first and second margin current branches may comprise a control switch coupled to the sense amplifier circuit and configured to control flow of the first and second margin currents. The control switch of the first margin current branch may be configured to perform a logic check operation on the first PCM element by adding the first margin current to the first sense current during the sense operation. The control switch of the second margin current branch may be configured to perform a logic check operation on the second PCM element by adding the second margin current to the second sense current during the sense operation. By selectively adding margin currents to the two branches, the robustness of the margin current between the two cells in differential configuration may be tested. When the margin current becomes lower than a predetermined threshold, the memory cells may be refreshed. This may be useful for all differential memories that are subject to a current drift with aging that could reduce the current margin.

In some embodiments, the differential PCM memory may further comprise a controller configured to flag the first and second PCM elements with an error value when the sense operation has a different output value when the first and second margin currents are added. Each of the first and second margin current branches may comprise a plurality of current sources. Each of the first and second margin current branches may be configured to generate different margin currents.

Additionally, the sense amplifier circuit may comprise a first stage current integrator circuit coupled to the first and second PCM elements, and a second stage comparator circuit coupled downstream from the first stage current integrator circuit. The sense amplifier circuit may comprise a third stage latch circuit coupled downstream from the second stage comparator circuit and configured to output an output signal based upon the difference between the first and second sense currents.

Another aspect is directed to a method for making a differential PCM memory. The method may include forming first and second PCM elements, and forming a sense amplifier circuit configured to sense a difference between first and second sense currents passing through the first and second PCM elements, respectively, during a sense operation. The method may include forming a first margin current branch coupled in parallel with the first PCM element and configured to selectively add a first margin current to the first sense current, and forming a second margin current branch coupled in parallel with the second PCM element and configured to selectively add a second margin current to the second sense current.

Another aspect is directed to a method for checking and refreshing a differential PCM memory. The differential PCM memory may include first and second PCM elements, a sense amplifier circuit configured to sense a difference between first and second sense currents passing through the first and second PCM elements, respectively, during a sense operation, a first margin current branch coupled in parallel with the first PCM element, and a second margin current branch coupled in parallel with the second PCM element. The method may include during the sense operation, using the first margin current branch to selectively add a first margin current to the first sense current, and during the sense operation, using the second margin current branch to selectively add a second margin current to the second sense current. This method allows to check the margin robustness, and to refresh the cells in case the current margin selected is not respected.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
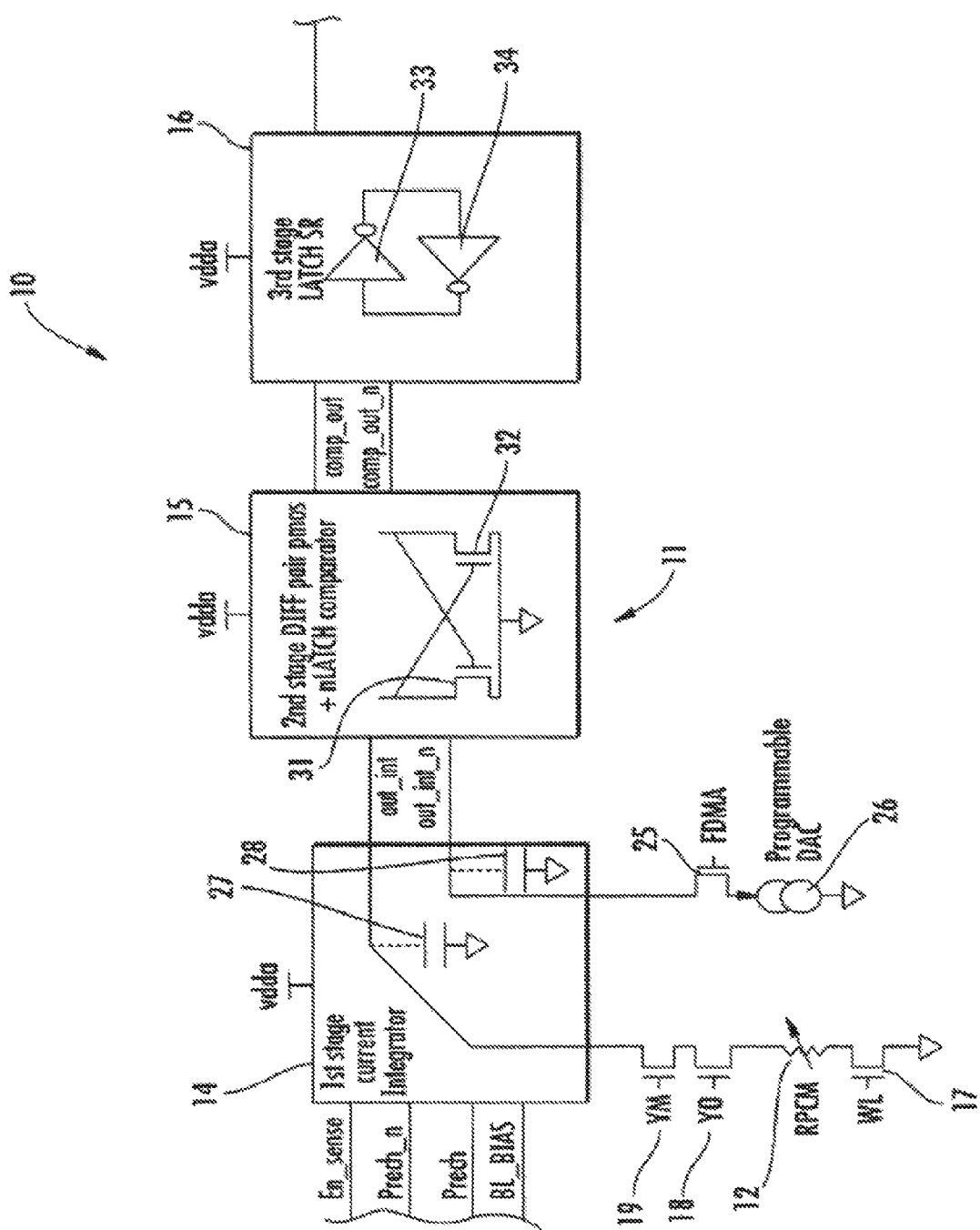
FIG. 1 shows a schematic diagram of a single ended PCM memory, according to the present disclosure.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

The present invention will be described with respect to preferred embodiments in a specific context, a memory system with margin current additions in various memory technology implementations and with particular memory sensing circuits. Embodiments of the present invention may also be used with other memory technologies as well as with other memory sensing circuit.

Referring to FIG. 1, an approach to a PCM memory 10 is now described. The PCM memory 10 illustratively includes a PCM element branch comprising a PCM element 12, a write line transistor (e.g. the illustrated metal-oxide-semiconductor field-effect transistor (MOSFET), a bipolar junction transistor (BJT), or a junction gate field-effect transistor (JFET)) 17 coupled to a first end of the PCM element, and first and second read transistors (e.g. the illustrated MOSFET, a BJT, or a JFET) 18-19 coupled to a second end of the PCM element. The PCM memory 10 illustratively includes a reference branch comprising a settable current source (e.g. the illustrated programmable digital-to-analog converter) 26, and a reference transistor (e.g. the illustrated MOSFET, a BJT, or a JFET) 25 coupled to the settable current source.

The PCM memory 10 illustratively includes a sense amplifier circuit 11 configured to sense a difference during a sense operation between a sense current passing through the PCM element 12 and a reference current from the settable current source 26. The sense amplifier circuit 11 illustratively includes a first stage current integrator circuit 14 coupled to the PCM element branch and the reference branch. The first stage current integrator circuit 14 illustratively includes first and second extracted capacitances 27-28 respectively coupled to the PCM element branch and the reference branch.

The sense amplifier circuit 11 illustratively includes a second stage comparator circuit 15 coupled downstream from the first stage current integrator circuit 14. The second stage comparator circuit 15 illustratively includes first and second transistors (e.g. the illustrated MOSFET, a BJT, or a JFET) 31-32. The sense amplifier circuit 11 illustratively includes a third stage latch circuit 16 coupled downstream from the second stage comparator circuit 15 and configured to output an output signal based upon the difference between the sense current and the reference current. The third stage latch circuit 16 illustratively includes a simple reset (SR) latch circuit having cross-coupled first and second inverters 33-34, but other latch configurations could be used.

The PCM memory 10 may have some potential drawbacks. For example, the PCM memory 10 is single ended, and the PCM element 12 may suffer current drift as time passes, thereby reducing the differential between the sensed current and the reference current, which can provide erroneous readout and increase access time. Hence, there is a need to improve the reliability of the PCM memory 10 as time passes and to address degradation in the PCM element 12.

Figure 2:
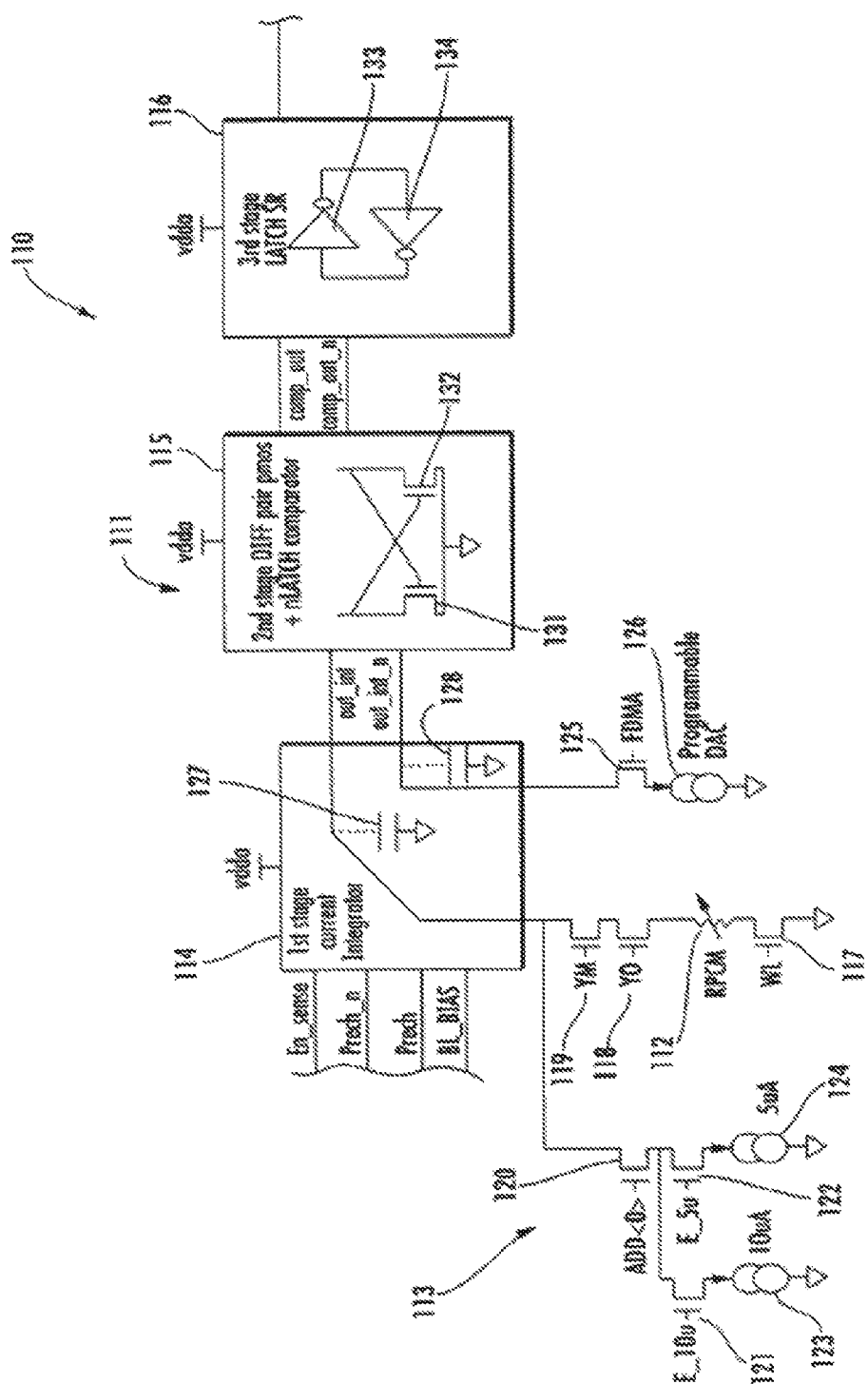
FIG. 2 shows a schematic diagram of another embodiment of the PCM memory, according to the present disclosure.

Referring now additionally to FIG. 2, another embodiment of the PCM memory 110 is now described. In this embodiment of the PCM memory 110, those elements already discussed above with respect to FIG. 1 are incremented by 100 and most require no further discussion herein. This embodiment differs from the previous embodiment in that this PCM memory 110 illustratively includes a margin current branch 113 coupled in parallel with the PCM element 112 and configured to selectively add a margin current to the sense current.

More specifically, the margin current branch 113 illustratively includes a control switch (e.g. the illustrated MOSFET, a BJT, or a JFET) 120 coupled to the sense amplifier circuit 111 and configured to control flow of the margin current. The control switch 120 is configured to perform a logic check operation on the PCM element 112 by adding the margin current to the sense current during the sense operation.

The margin current branch 113 illustratively includes a plurality of current sources 123-124, and a plurality of sub-control switches (e.g. the illustrated MOSFET, a BJT, or a JFET) 121-122 respectively coupled to the plurality of current sources. Via selective control of the plurality of sub-control switches 121-122, the margin current may be selectively varied via current addition, i.e. to generate different margin currents (e.g. the illustrated 5 µA, 10 µA, and 15 µA) for addition to the sense current.

Helpfully, the PCM memory no may detect degradation in the PCM element 112 if the detected data value changes when adding the margin current. This embodiment of the PCM memory no may provide an approach to detecting degradation in the PCM element 112. This may provide for a more reliable PCM memory 110 and faster access times.

Another aspect is directed to a method for making a PCM memory 110. A method according to the aspect includes forming a PCM element 112, and forming a sense amplifier circuit 111 configured to sense a difference during a sense operation between a sense current passing through the PCM element and a reference current. A method according to the aspect includes forming a margin current branch 113 coupled in parallel with the PCM element 112 and configured to selectively add a margin current to the sense current.

Another aspect is directed to a method for checking and refreshing a PCM memory 110. The PCM memory no includes a PCM element 112, a sense amplifier circuit 111 configured to sense a difference during a sense operation between a sense current passing through the PCM element and a reference current, and a margin current branch 113 coupled in parallel with the PCM element. A method according to the aspect comprises during the sense operation, using the margin current branch 113 to selectively add a margin current to the sense current.

Figure 3:
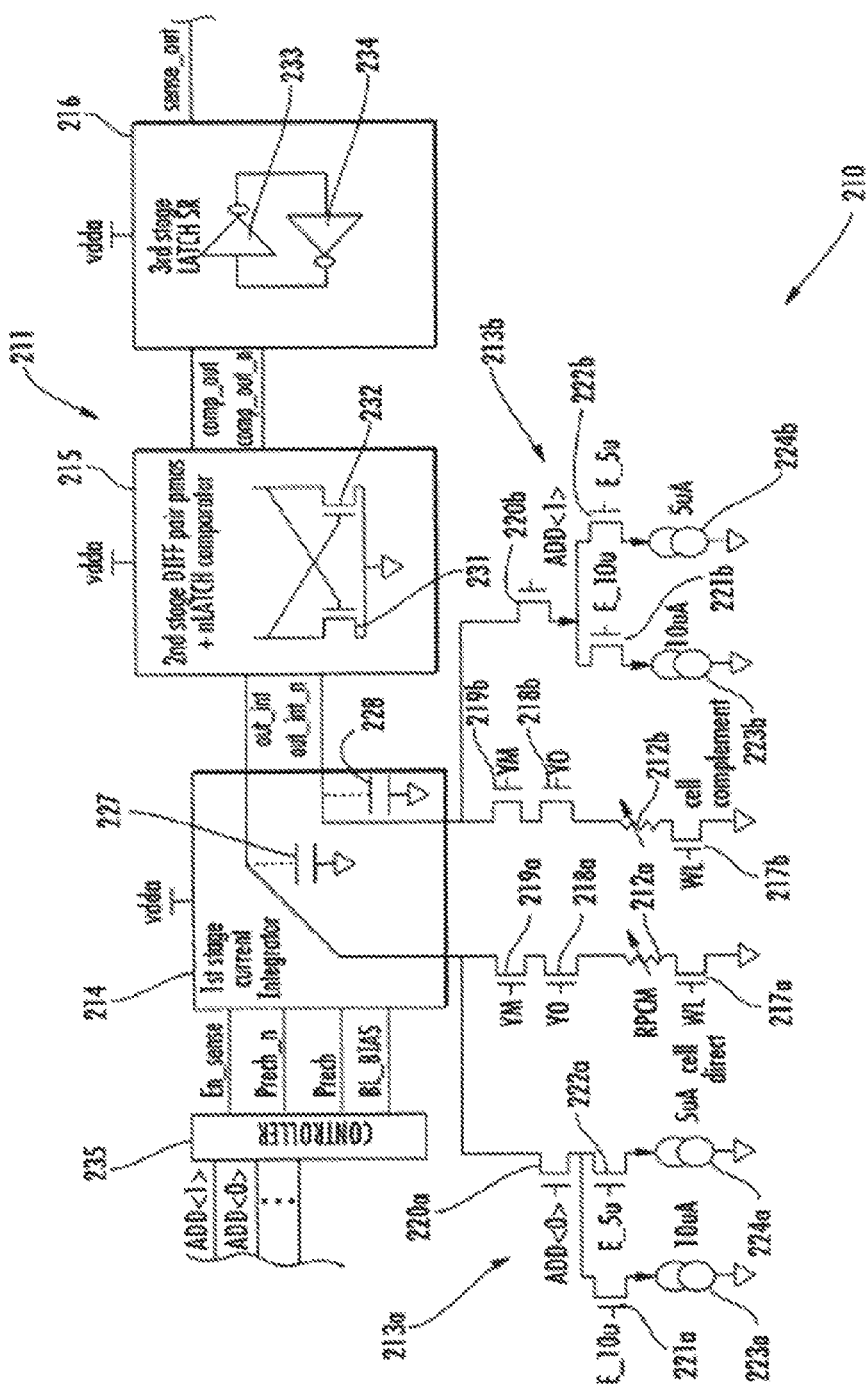
FIG. 3 shows a schematic diagram of a differential PCM memory, according to the present disclosure.
Figure 4:
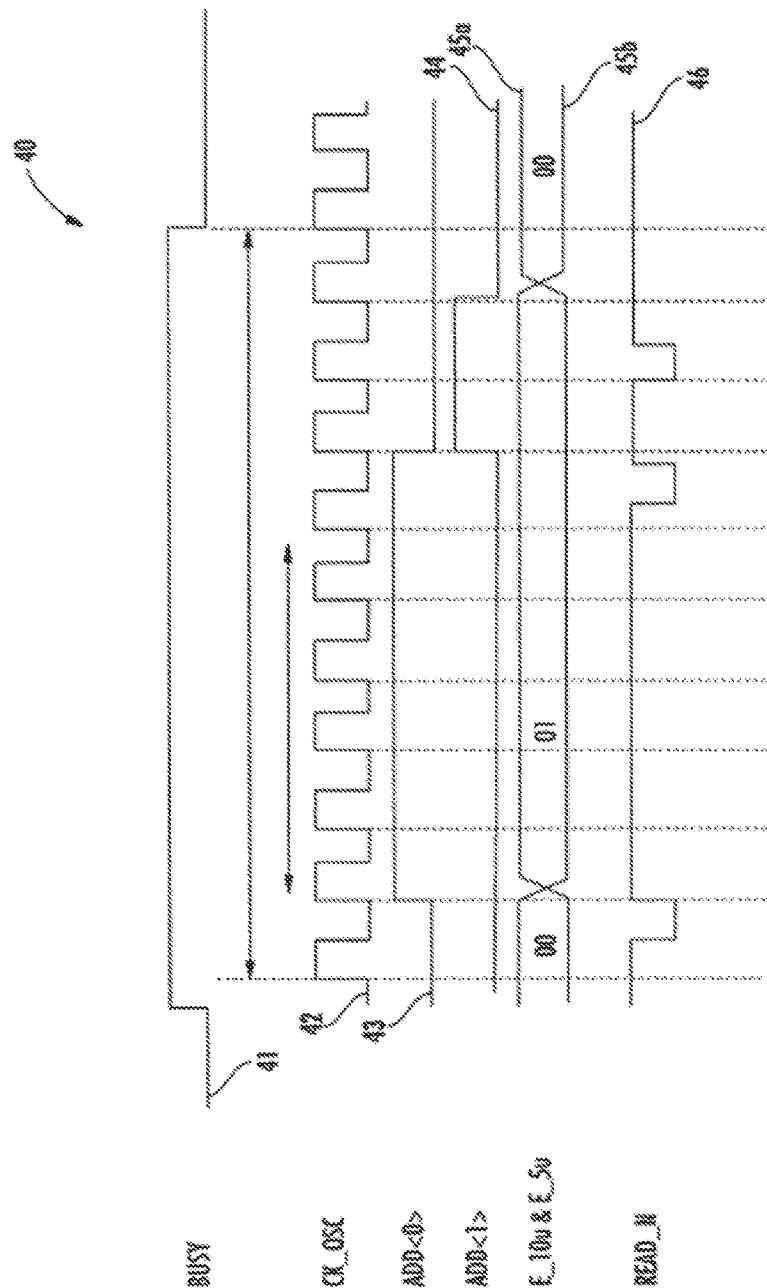
FIG. 4 shows a timing diagram for the differential PCM memory of FIG. 3.
Figure 5:
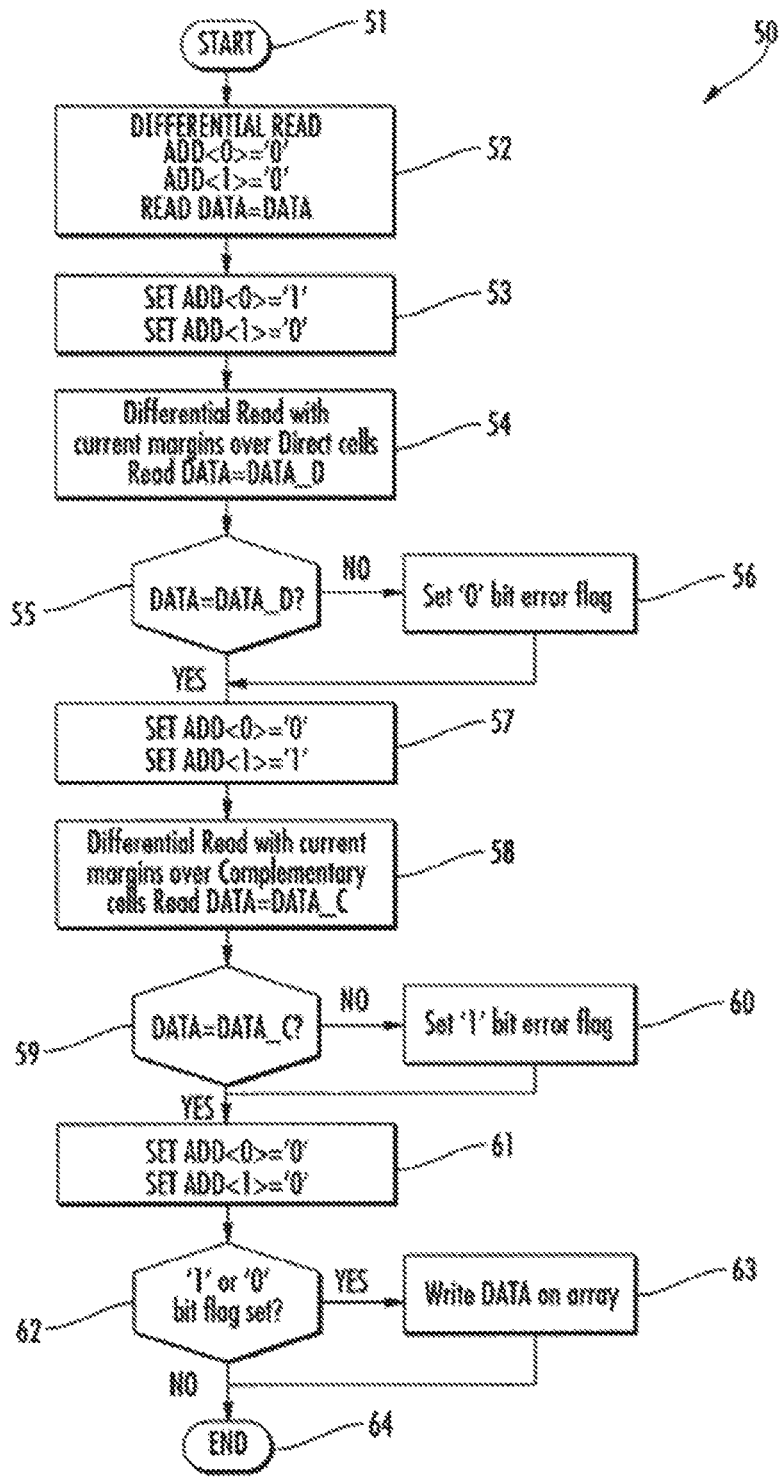
FIG. 5 shows a flowchart of a check and refresh procedure embedded in a differential PCM, according to an embodiment of the present invention.

Referring now additionally to FIGS. 3-5, another embodiment of the PCM memory 210 is now described. In this embodiment of the PCM memory 210, those elements already discussed above with respect to FIGS. 1-2 are incremented by 200 and most require no further discussion herein. This embodiment differs from the previous embodiment in that this PCM memory 210 is a differential PCM memory (i.e. having first/direct and second/complementary memory elements). The differential PCM memory 210 illustratively comprises first and second PCM elements 212a-212b, (i.e. the direct read and complementary read PCM cells), and a sense amplifier circuit 211 configured to sense a difference between first and second sense currents passing through the first and second PCM elements, respectively, during a sense operation. The differential PCM memory 210 illustratively includes a first margin current branch 213a coupled in parallel with the first PCM element 212a and configured to selectively add a first margin current to the first sense current, and a second margin current branch 213b coupled in parallel with the second PCM element 212b and configured to selectively add a second margin current to the second sense current.

More specifically, each of the first and second margin current branches 213a-213b comprises a control switch 220a-220b coupled to the sense amplifier circuit 211 and configured to control flow of the first and second margin currents. The control switch 220a of the first margin current branch 213a is configured to perform a logic check operation on the first PCM element 212a by adding the first margin current to the first sense current during the sense operation. The control switch 220b of the second margin current branch 213b is configured to perform a logic check operation on the second PCM element 212b by adding the second margin current to the second sense current during the sense operation. In the illustrated embodiment, the differential PCM memory 210 further comprises a controller 235 configured to flag the first and second PCM elements 212a-212b with an error value (e.g. an error bit value) when the sense operation has a different output value when the first and second margin currents are added.

Another aspect is directed to a method for making a differential PCM memory 210. A method according to the aspect includes forming first and second PCM elements 212a-212b, and forming a sense amplifier circuit 211 configured to sense a difference between first and second sense currents passing through the first and second PCM elements, respectively, during a sense operation. A method according to the aspect includes forming a first margin current branch 213a coupled in parallel with the first PCM element 212a and configured to selectively add a first margin current to the first sense current, and forming a second margin current 213b branch coupled in parallel with the second PCM element 212b and configured to selectively add a second margin current to the second sense current.

Another aspect is directed to a method for checking and refreshing a differential PCM memory 210. The differential PCM memory 210 includes first and second PCM elements 212a-212b, a sense amplifier circuit 211 configured to sense a difference between first and second sense currents passing through the first and second PCM elements, respectively, during a sense operation, a first margin current branch 213a coupled in parallel with the first PCM element, and a second margin current branch 213b coupled in parallel with the second PCM element. A method according to the aspect includes during the sense operation, using the first margin current branch 213a to selectively add a first margin current to the first sense current, and during the sense operation, using the second margin current branch 213b to selectively add a second margin current to the second sense current.

Referring now to FIG. 4, a timing diagram 40 is now described. The timing diagram 40 shows a busy signal 41, a clock signal 42, an ADD<0> signal 43 configured to activate the control switch 220a of the first margin current branch 213a, an ADD<1> signal 44 configured to activate the control switch 220b of the second margin current branch 213b, an E_10u signal 45a configured to activate the sub-control switch 221a of the first and second margin current branches 213a-213b, an E_5u signal 45b configured to activate the sub-control switch 221b of the first and second margin current branches 213a-213b, and a READ_N signal 46.

Referring now to FIG. 5, a flowchart 50 and a method for checking and refreshing the differential PCM memory 210 is now described. (Block 51). At Block 52, the control switches 220a-220b are opened and a normal differential read operation is performed. At Blocks 53-55, the first margin current is added to the first sense current of the first PCM element 212a and a differential read operation is performed (i.e. performing a logic check on a "0" bit). If the read data from this differential read operation differs from that of the normal differential read operation, the error flag for the 0's (the direct cell 212a) is set at Block 56.

At Blocks 57-59, the second margin current is added to the second sense current of the second PCM element 212b and a differential read operation is performed (i.e. performing a logic check on a "1" bit). If the read data from this differential read operation differs from that of the normal differential read operation, the error flag for the 1's (the complementary cell 212b) is set at Block 60. In other words, the method may include three separate differential read operations (i.e. a normal read, and two margin current addition reads). At Blocks 61-64, the control switches 220a-

220b are opened, and if any error flag is set, the data is rewritten to the first and second PCM elements 212a-212b. In some embodiments, the controller 235 is configured to store each memory word with a command bit for activating the above described memory check and refresh method.

The above described memory check and refresh method may use only three memory read accesses, which provides a fast memory check without introducing significant latency. A method according to the aspect also provides for reduced access time to the PCM memories 110, 210 due to the greater read margins (i.e. a greater differential at inputs leads to the comparators providing output faster).

Also, the disclosed method can check data content robustness in specific moment and can refresh content in case of reduced cells current margins. This provides an approach to issues with differential PCM memories, where the direct and complementary cells have a specific behavior.

Figure 6A:
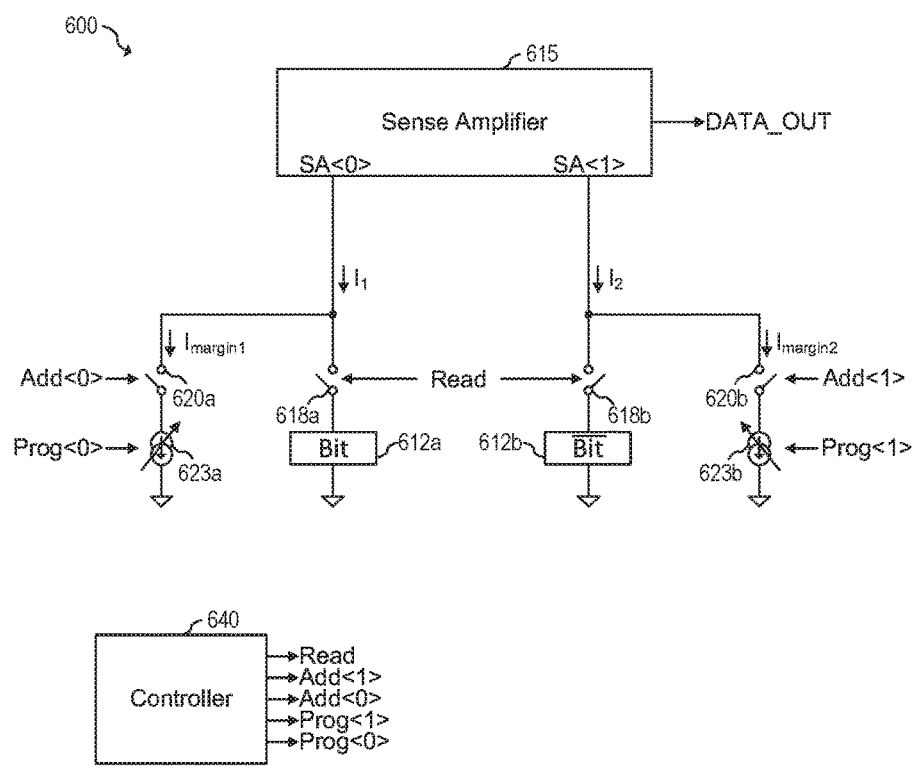
FIGS. 6a and 6b show schematic diagrams of a memory, according to an embodiment of the present invention.

It is understood that the systems and methods described herein are not limited to PCM memories. For example, FIG. 6a shows a schematic of memory 600, according to embodiments of the present invention. FIG. 6a omits some of the components for clarity purposes. Memory 600 includes memory bit 612a, complementary bit 612b, programmable current sources 623a and 623b, switches 620a, 618a, 618b, and 620b, sense amplifier 615 and controller 640.

During normal operation, memory 600 may operate with switches 620a and 620b constantly open. In other words, sense amplified 615 may sense the difference between currents $I_1$ and $I_2$ with current $I_{margin1}$ being zero and current $I_{margin2}$ being zero.

During a check operation, sense amplifier 615, may initially sense a first current difference between currents $I_1$ and $I_2$ with switches 620a and 620b open. A second current difference may be sensed with switch 620a closed and switch 620b open. A third current difference may be sensed with switch 620a open and switch 620b closed. If either the second or third current difference is different from the first current difference, it may indicate that memory 600 is degrading. In such a case, a refresh operation that reprograms bits 612a and 612b with their respective original values is performed. An alert flagging memory 600 as a memory that failed the margin test may be issued. In some embodiments, the refresh operation may be executed automatically after the alert is issued.

The check operation may be executed at various times, depending on the specific application. For example, applications where the memory is exposed to environments that make the particular memory technology susceptible to degrade, such as, for example, high temperature applications, may perform the check operation every time the memory powers up. Other applications may perform the check operation after a user request, where the user may be, for example, an external controller. In some embodiments, the check operation may be performed during manufacturing, for example, in cases where the memory has default content.

Memory bit 612a and complementary bit 612b may be implemented with PCM technology. Alternative, other technologies that may be programmed to have different resistances may be used, such as resistive random-access memory technology (RRAM), and magnetoresistive random-access memory technology (MRAM). In some embodiments, memory bit 612a and complementary bit 612b may be implemented with technologies that are configured to produce a high current or a low current depending on the state programmed, such as memories using floating gates.

Programmable current sources 623a and 623b may be implemented with multiple current sources and a selecting mechanism, such as the implementation shown in FIG. 3, where, for example, current source 623a is implemented with current source 223a, which is selectable with transistor 221a, and current source 224a, which is selectable with transistor 222a. Programmable current sources 623a and 623b may be implemented in other ways known in the art.

Some embodiments may implement programmable current source 623a as a bidirectional current source. In other words, programmable current source may be capable of generating a current in both positive and negative directions. In such embodiments, current source 623b may not be implemented.

Switches 620a, 618a, 620b and 618b may be implemented in any way known in the art. For example, switches 620a, 618a, 620b and 618b may be implemented with NMOS transistors.

Figure 6B:
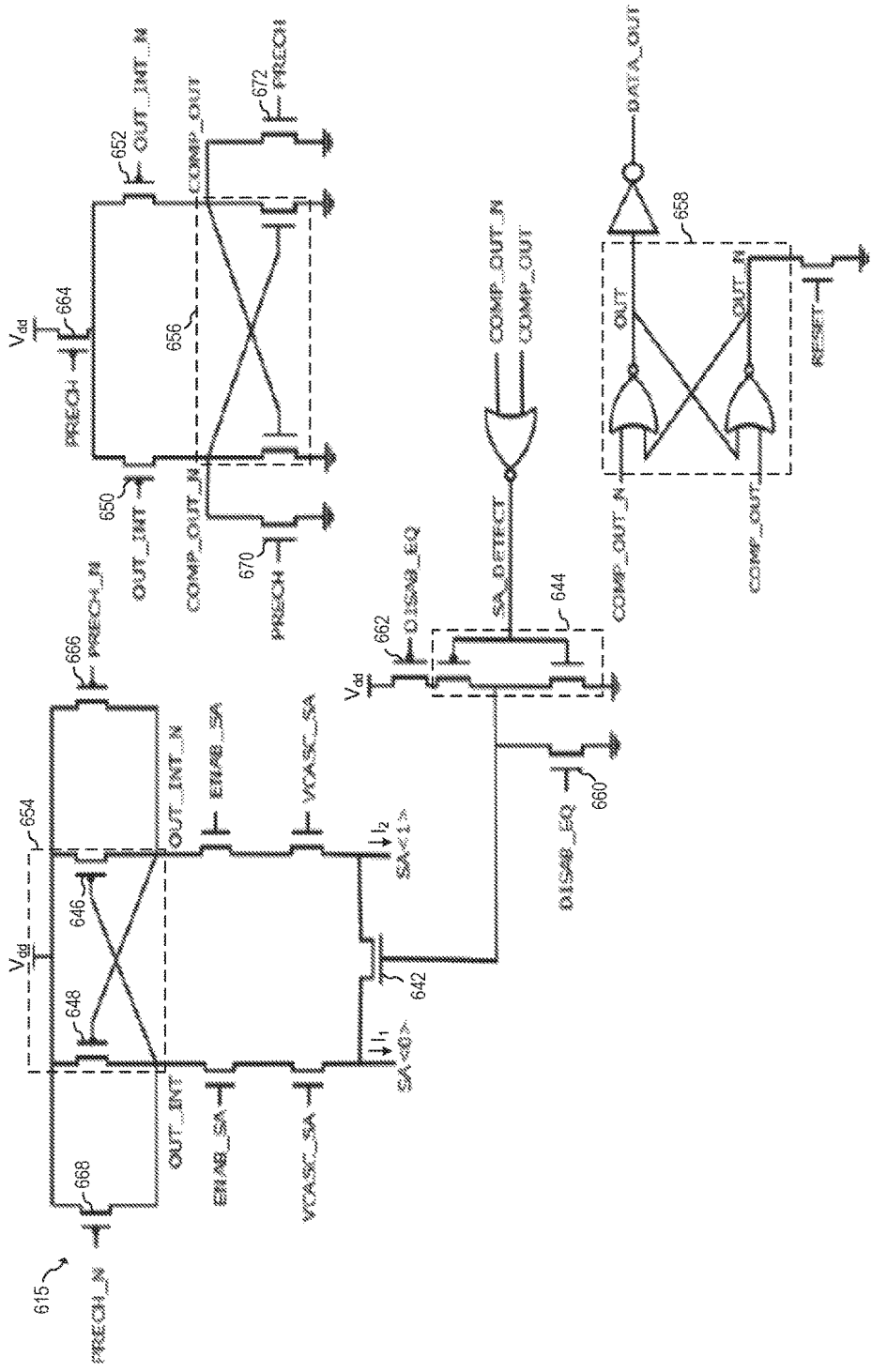

Sense amplifier 615 may be implemented as a differential amplifier that produces a single ended logic output. For example, FIG. 6b shows a schematic of sense amplifier 615, according to an embodiment of the present invention. As can be seen from FIG. 6b, when current $I_1$ is greater than current $I_2$, transistor 646 turns on and transistor 648 turns off, thereby causing OUT_INT_N to be high and OUT_INT to be low. When OUT_INT_N is high and OUT_INT is low, transistor 650 is on and transistor 652 is off, thereby causing COMP_OUT_N to be high and COMP_OUT to be low. When COMP_OUT_N is high and COMP_OUT is low, DATA_OUT is high. When COMP_OUT_N is high and COMP_OUT is low, signal SA_DETECT is low, thereby causing the inverter 644 to output high and turn on transistor 642, which in turn shorts the inputs of sense amplifier 615, thereby causing latches 654, 656 and 658 to retain their content. A similar, but opposite, behavior is exhibited when current $I_2$ is greater than current $I_1$.

Transistor 642 may be turned off after a sense operation to avoid shorting the input of sense amplifier 615. Transistor 642 may be turned off, for example, by turning on transistor 660 and turning off transistors 662. Signal DISAB_EQ may be used to turn on transistor 660 and turn off transistor 662. Other implementations and methods known in the art may be used.

Signals OUT_INT and OUT_INT_N may be pre-charged to $V_{dd}$ before a sense operation. Signals OUT_INT and OUT_INT_N, thereby, may turn off transistors 650 and 652. Signals OUT_INT and OUT_INT_N may be pre-charged by signal PRECH being high, and corresponding PRECH_N signal being low. When PRECH+N is low, transistors 666 and 668 may be on, hereby pre-charging OUT_INT and OUT_INT_N to $V_{dd}$. When PRECH is high, transistor 664 may be off and transistors 670 and 672 may be on.

A reset signal may be used to initialize the output of sense amplified 615. For example, signal RESET, when high, may cause DATA_OUT to be low.

Sense amplified 615 may be disabled, for example, to save power. For example, signal ENAB_SA may be used to disable sense amplified 615 when not in use. When signal ENAB_SA is low, sense amplifier 615 may be disabled. When signal ENAB_SA is high, sense amplifier 615 may be enabled.

The voltage on the inputs of sense amplifier 615 may be regulated to appropriate levels for a particular operation on a particular memory technology. Signal VCASC_SA may be used to regulate the voltage on the inputs of sense amplifier 615 to appropriate levels.

It is described: A phase change material (PCM) memory comprising: a PCM element; a sense amplifier circuit configured to sense a difference during a sense operation between a sense current passing through the PCM element and a reference current; and a margin current branch coupled in parallel with the PCM element and configured to selectively add a margin current to the sense current.

The margin current branch may comprise a control switch coupled to the sense amplifier circuit and configured to control flow of the margin current.

The control switch may be configured to perform a logic check operation on the PCM element by adding the margin current to the sense current during the sense operation.

The PCM memory may comprise a controller configured to flag the PCM element with an error value when the sense operation has a different output value when the margin current is added.

The margin current branch may comprise a plurality of current sources.

The margin current branch may be configured to generate different margin currents.

A method for making a phase change material (PCM) memory, the method comprising: forming a PCM element; forming a sense amplifier circuit configured to sense a difference during a sense operation between a sense current passing through the PCM element and a reference current; and forming a margin current branch coupled in parallel with the PCM element and configured to selectively add a margin current to the sense current.

The margin current branch may comprise a control switch coupled to the sense amplifier circuit and configured to control flow of the margin current.

The control switch may be configured to perform a logic check operation on the PCM element by adding the margin current to the sense current during the sense operation.

The PCM element may be flagged with an error value when the sense operation has a different output value when the margin current is added.

The margin current branch may comprise a plurality of current sources.

A method for checking and refreshing a phase change material (PCM) memory comprising a PCM element, a sense amplifier circuit configured to sense a difference during a sense operation between a sense current passing through the PCM element and a reference current, and a margin current branch coupled in parallel with the PCM element, the method comprising: during the sense operation, using the margin current branch to selectively add a margin current to the sense current.

The margin current branch may comprise a control switch coupled to the sense amplifier circuit and configured to control flow of the margin current.

The control switch may be configured to perform a logic check operation on the PCM element by adding the margin current to the sense current during the sense operation.

The method may further comprise flagging the PCM element with an error value when the sense operation has a different output value when the margin current is added.

The margin current branch may comprises a plurality of current sources. While this detailed description has set forth some embodiments of the present invention, the appended claims cover other embodiments of the present disclosure which differ from the described embodiments according to various modifications and improvements. For example, the herein described PCM memories could be applied within an array of such memory devices.

One general aspect includes a circuit including: a sense amplifier circuit configured to sense a difference between a first current based on a direct memory bit and a second current based on a complementary memory bit, the direct memory bit coupled to a first input of the sense amplifier circuit, and the complementary memory bit coupled to a second input of the sense amplifier circuit; and a controller configured to, during a sense operation, selectively add a first margin current to the first current, and during the sense operation, selectively add a second margin current to the second current.

Implementations may include one or more of the following features. The circuit where the direct memory bit includes a first variable resistance and the complementary memory bit includes a second variable resistance. The circuit where the direct memory bit includes a phase change material (PCM) and the complementary memory bit includes a PCM. The circuit where the direct memory bit and the complementary memory bit are implemented with resistive random-access memory technology (RRAM). The circuit where the direct memory bit and the complementary memory bit are implemented with magnetoresistive random-access memory technology (MRAM). The circuit where the direct memory bit includes a first floating gate transistor and the complementary memory bit includes a second floating gate transistor. The circuit where the first margin current is programmable and the second margin current is programmable. The circuit where the first margin current is programmable between 5 uA and 15 uA. The circuit where the controller is further configured to: during the sense operation, capture a first difference between the first current and the second current; add the first margin current to the first current; after adding the first margin current, capture a second difference between the first current and the second current; and if the first difference has opposite polarity to the second difference, issue a flag. The circuit where the controller is further configured to, after the flag is issued, refresh the memory bit and the complementary memory bit.

Another general aspect includes a method of operating a memory, the method including: executing a check operation including sensing a first difference between a first current based on a direct memory bit and a second current based on a complementary memory bit; adding a first margin current to the first current; and after adding the first margin current, sensing a second difference between the first current and the second current.

Implementations may include one or more of the following features. The method where the check operation further includes: if the first difference has opposite polarity to the second difference, issue a flag. The method further including, after the flag is issued, executing a refresh operation. The method where executing the check operation includes executing the check operation when the memory powers up. The method where the first margin current has a same direction of the first current. The method where the first margin current has opposite direction of the first current.

Yet another general aspect includes a circuit including: a sense amplifier circuit configured to sense a difference between a first current based on a direct memory bit and a second current based on a complementary memory bit, the direct memory bit being coupled to a first input of the sense amplifier circuit, and the complementary memory bit being coupled to a second input of the sense amplifier circuit; a first current source coupled to the first input of the sense amplifier circuit, the first current source configured to generate a first margin current; a second current source coupled to the second input of the sense amplifier circuit, the second current source configured to generate a second margin current; a latch coupled to an output of the sense amplifier circuit; and a controller configured to selectively add the first margin current to the first current, and selectively add the second margin current to the second margin current.

Implementations may include one or more of the following features. The circuit where the first current source includes a first auxiliary current source and a second auxiliary current source. The circuit where the sense amplifier circuit includes: a first latch coupled to the first input of the sense amplifier circuit and further coupled to the second input of the sense amplifier circuit; a second latch coupled to an output of the first latch; and a third latch coupled to an output of the second latch. The circuit where the sense amplifier circuit further includes a transistor coupled between the first input of the sense amplifier circuit and the second input of the sense amplifier circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a sense amplifier circuit configured to sense a difference between a first current based on a direct memory bit and a second current based on a complementary memory bit, the direct memory bit coupled to a first input of the sense amplifier circuit, and the complementary memory bit coupled to a second input of the sense amplifier circuit, wherein the direct memory bit is configured to hold a first value, and the complementary memory bit is configured to hold a second value opposite the first value; and
   a controller configured to, during a sense operation, selectively add a first margin current to the first current and selectively add a second margin current to the second current.

2. The circuit of claim 1, wherein the direct memory bit comprises a first variable resistance and the complementary memory bit comprises a second variable resistance.

3. The circuit of claim 1, wherein the direct memory bit comprises a phase change material (PCM) and the complementary memory bit comprises a PCM.

4. The circuit of claim 1, wherein the direct memory bit and the complementary memory bit are implemented with resistive random-access memory technology (RRAM).

5. The circuit of claim 1, wherein the direct memory bit and the complementary memory bit are implemented with magnetoresistive random-access memory technology (MRAM).

6. The circuit of claim 1, wherein the direct memory bit comprises a first floating gate transistor and the complementary memory bit comprises a second floating gate transistor.

7. A circuit comprising:
   a sense amplifier circuit configured to sense a difference between a first current based on a direct memory bit and a second current based on a complementary memory bit, the direct memory bit coupled to a first input of the sense amplifier circuit, and the complementary memory bit coupled to a second input of the sense amplifier circuit; and
   a controller configured to, during a sense operation, selectively add a first margin current to the first current and selectively add a second margin current to the second current, wherein the first margin current is programmable and the second margin current is programmable.

8. The circuit of claim 7, wherein the first margin current is programmable between 5 uA and 15 uA.

9. The circuit of claim 1, wherein the controller is further configured to:
   during the sense operation,
      capture a first difference between the first current and the second current;
      add the first margin current to the first current;
      after adding the first margin current, capture a second difference between the first current and the second current; and
      issue a flag if the first difference has opposite polarity to the second difference.

10. The circuit of claim 9, wherein the controller is further configured to, after the flag is issued, refresh the memory bit and the complementary memory bit.

11. A method of operating a memory, the method comprising executing a check operation by:
    sensing a first difference between a first current based on a direct memory bit and a second current based on a complementary memory bit;
    adding a first margin current to the first current; and
    after adding the first margin current, sensing a second difference between the first current and the second current, wherein the check operation further comprises issuing a flag when the first difference has opposite polarity to the second difference.

12. The method of claim 11, wherein the first difference has opposite polarity to the second difference, the method further comprising executing a refresh operation after the flag is issued.

13. The method of claim 12, wherein executing the check operation comprises executing the check operation when the memory powers up.

14. The method of claim 11, wherein the first margin current has the same direction of the first current.

15. The method of claim 11, wherein the first margin current has opposite direction of the first current.

16. A circuit comprising:
    a sense amplifier circuit configured to sense a difference between a first current based on a direct memory bit and a second current based on a complementary memory bit, the direct memory bit being coupled to a first input of the sense amplifier circuit, and the complementary memory bit being coupled to a second input of the sense amplifier circuit;
    a first current source coupled to the first input of the sense amplifier circuit, the first current source configured to generate a first margin current;
    a second current source coupled to the second input of the sense amplifier circuit, the second current source configured to generate a second margin current;
    a latch coupled to an output of the sense amplifier circuit; and
    a controller configured to
       selectively add the first margin current to the first current, and
       selectively add the second margin current to the second margin current, wherein the first current source comprises a first auxiliary current source and a second auxiliary current source.

17. The circuit of claim 16, wherein the sense amplifier circuit comprises:

a first latch coupled to the first input of the sense amplifier circuit and further coupled to the second input of the sense amplifier circuit;
a second latch coupled to an output of the first latch; and
a third latch coupled to an output of the second latch.

18. The circuit of claim 17, wherein the sense amplifier circuit further comprises a transistor coupled between the first input of the sense amplifier circuit and the second input of the sense amplifier circuit.

19. The circuit of claim 1, further comprising:
a first current source coupled to the first input of the sense amplifier circuit, the first current source configured to generate the first margin current; and
a second current source coupled to the second input of the sense amplifier circuit, the second current source configured to generate the second margin current.

20. The method of claim 11, further comprising:
generating the first margin current with a first current source.

* * * * *